United States Patent
Mort, Jr. et al.

(10) Patent No.: US 11,028,535 B2
(45) Date of Patent: Jun. 8, 2021

(54) FIRE SUPPRESSING PLEATED PACKAGING PAPER AND METHOD OF MANUFACTURING

(71) Applicant: Packaging and Crating Technologies, LLC, Waterbury, CT (US)

(72) Inventors: Rodger A. Mort, Jr., Altmar, NY (US); Guy Leath Gettle, Alamo, CA (US)

(73) Assignee: Packaging and Crating Technologies, LLC, Waterbury, CT (US)

(*) Notice: Subject to any disclaimer, the term of this patent is extended or adjusted under 35 U.S.C. 154(b) by 199 days.

(21) Appl. No.: 16/197,616

(22) Filed: Nov. 21, 2018

(65) Prior Publication Data
US 2020/0157741 A1 May 21, 2020

(51) Int. Cl.
| | | |
|---|---|---|
| *D21F 11/12* | (2006.01) | |
| *D21H 27/10* | (2006.01) | |
| *D21H 19/58* | (2006.01) | |
| *G03F 7/16* | (2006.01) | |
| *G03F 7/00* | (2006.01) | |
| *C09D 11/107* | (2014.01) | |
| *C09D 5/18* | (2006.01) | |

(52) U.S. Cl.
CPC .......... *D21F 11/12* (2013.01); *D21H 19/58* (2013.01); *D21H 27/10* (2013.01); *G03F 7/0005* (2013.01); *G03F 7/16* (2013.01); *C09D 5/18* (2013.01); *C09D 11/107* (2013.01)

(58) Field of Classification Search
USPC .......................................... 162/112; 428/181
See application file for complete search history.

(56) References Cited

U.S. PATENT DOCUMENTS

| | | |
|---|---|---|
| 3,936,339 A | 2/1976 | Lock |
| 4,748,066 A | 5/1988 | Kelly |
| 6,871,480 B1 | 3/2005 | Goodrich |
| 7,465,267 B2 | 12/2008 | Goodrich |
| 9,808,753 B2 * | 11/2017 | Lise .................... B01D 29/012 |
| 2003/0116054 A1 | 6/2003 | John |
| 2009/0081416 A1 | 3/2009 | Goodrich |
| 2015/0231867 A1 | 8/2015 | Kelly |

* cited by examiner

*Primary Examiner* — Mark Halpern
(74) *Attorney, Agent, or Firm* — Carmody Torrance Sandak & Hennessey LLP

(57) ABSTRACT

The present invention includes pleated paper and planar paper coated with a fire suppressive ink, wherein the pleated paper is Kraft paper with a weight of 25 to 50 pounds, with pleat angles of about 88 to 92°, and pleat heights between approximately 3/32 of an inch and 1/8 of an inch, and the planar paper is Kraft paper with a weight of 40 to 60 pounds. The fire suppressive ink is preferably applied with a flexographic printing process and preferably comprises at least one inorganic fusible salt and an organic resin. The inventive pleated paper is an environmentally friendly packaging material with improved protective qualities, which can also shield items from fire, contain fires, and suppress fires to avoid thermal runaway. The inventive paper is particularly useful for packaging and shipping flammable items, such as lithium-ion batteries.

25 Claims, 2 Drawing Sheets

FIRE SUPPRESSING PLEATED PACKAGING PAPER AND METHOD OF MANUFACTURING

FIELD OF THE INVENTION

The present invention relates to pleated paper that has fire suppressive characteristics, and a method of producing such paper.

BACKGROUND OF THE INVENTION

Molded plastics, inflated plastics, and foam products have all been traditionally used to fill voids and to cushion and protect the contents of shipped packages. These packaging materials include packing peanuts, bubble wrap, foam blocks, and the like. While these materials have good protective qualities, they are not recyclable, biodegradable, or environmentally friendly. In addition, many recipients of shipped packages find these packaging materials difficult to handle, and particularly difficult to dispose of. In an effort to address these short-comings, various paper products have been developed to box and cushion packages. These paper products include corrugated fiberboard and pleated paper, each of which is recyclable, biodegradable, and environmentally friendly.

Pleated paper has other beneficial qualities, including good resilience and flexibility. U.S. Pat. No. 6,871,480 to Goodrich, the subject matter of which is herein incorporated by reference in its entirety, describes a method for creating pleated paper that uses a pair of mating gears to crush Kraft paper at the apices of each pleat. The mating gears have teeth. The top of each tooth is called a crest, and the valley between teeth is called the root. One key to creating resilient pleated paper in this manner is to make sharp (not rounded or fluted) creases at each apex. In this regard, Goodrich describes pleated angles between 45 and 85°. To accomplish sharp creases, the teeth of the mating gears must have a crest width that is smaller than the root width. The height of each pleat ranges from three-sixteenths of an inch to about a half inch. After pleating is completed, the paper is then adhesively bonded to at least one planar sheet of tissue paper. The result, according to Goodrich, is a product that is resiliently rigid, extremely flexible and moldable around objects.

U.S. Pat. No. 7,465,267 to Goodrich, the subject matter of which is herein incorporated by reference in its entirety, discloses a different method to pleat paper. The method includes a pair of rollers, one driven and one idle, which include a plurality of radially reduced sections, or keys. Each key is dimensioned to accommodate a pair of elongated fingers that create creases in the paper as it passes between the rollers. The key width is about 0.365 inches. The system avoids obtuse pleat angles and instead forms pleats with an apex angle under 45 degrees and more preferably less than 25 degrees.

While pleated paper has beneficial packaging qualities, it also has several downsides. Pleated paper, for example, has poor stacking strength, and can easily rip or be punctured. In addition, unlike most other packaging products, pleated paper is highly flammable. The inner pleated sheet consists of Kraft paper and the outer planar sheet consists of lightweight tissue paper (i.e., less than 20 pounds). Inherently, then, pleated paper can ignite and fuel a fire. As a result, the pleated paper of the prior art is a poor choice for packing items that represent fire hazards.

Lithium-ion batteries are one such example. These batteries are used in consumer electronics, including cellphones, laptop computers, cameras and rechargeable tools. They are also used to power electric cars. Despite their utility and popularity, lithium-ion batteries pose unique safety hazards because they contain a flammable electrolyte and only a thin piece of plastic separates the electrodes. If the battery is damaged, the plastic separator can fail allowing the electrodes to come into contact, shorting the circuit, and creating an electric charge that ignites the electrolyte. Once one cell is ignited, thermal runaway can occur and ignite other cells within the same battery and other batteries adjacently packed in the same shipment. Therefore, the art would benefit from packaging that could better cushion items that present fire hazards during transit, including Lithium-ion batteries, while shielding the packed items from fire, containing a fire within the package if it occurs, and suppressing the fire before a thermal runaway situation can occur.

Thus, it can be seen that there remains a need in the art for an improved packaging material that is recyclable, biodegradable, and environmentally friendly, and that can also protect shipped items from physical damage, shield items from fire, contain a fire if it starts within a package, and actively suppress the fire before a thermal runaway situation can occur.

SUMMARY OF THE INVENTION

It is an object of the present invention to provide a method of producing pleated paper that is recyclable, biodegradable, and environmentally friendly with improved protective packaging qualities.

It is another object of the present invention to provide a method of producing pleated paper that is recyclable, biodegradable, and environmentally friendly and that can also shield shipped items from fire.

It is still another object of the present invention to provide a method of producing pleated paper that is recyclable, biodegradable, and environmentally friendly and that can contain a fire if it starts within the package.

It is still yet another object of the present invention to provide a method of producing pleated paper that is recyclable, biodegradable, and environmentally friendly and that can actively suppress a fire to help avoid a thermal runaway situation.

It is further an object of the present invention to create non-flammable, pleated packaging paper.

It is finally an object of the present invention to create non-flammable, pleated packaging paper that has fire suppressive characteristics.

DETAILED DESCRIPTION OF THE PREFERRED EMBODIMENTS

Figure 1:
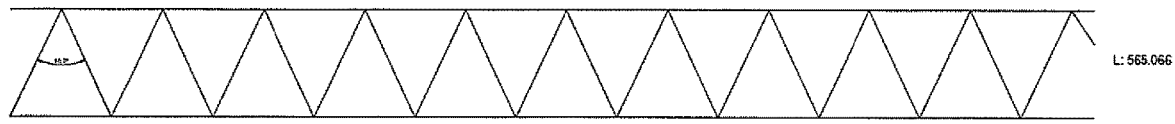
FIG. 1 depicts the pleat profile of the prior art.

"A," "an" and "the" as used herein refer to both singular and plural referents unless the context clearly dictates otherwise.

As used herein, the term "about" or "approximately" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" or "approximately" refers is itself specifically disclosed herein.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As used herein, the term "consisting essentially of" specifies a composition that does not contain any additional ingredients that would affect the ability of the pleated paper to suppress or resist fire.

The inventors of the present invention have developed a method of producing pleated packaging paper with improved wrapping and protective qualities that is also fire resistant and fire suppressive. The first step of the innovative method is to provide sheets of paper for pleating, which is preferably Kraft paper having a weight of 25 to 50 pounds, preferably 35 to 45 pounds, and most preferably approximately 40 pounds, and to provide sheets of paper for planar support, which is preferably Kraft paper having a weight of approximately 40 to 60 pounds, preferably 45 to 55 pounds, and most preferably 50 pound virgin Kraft paper. It was discovered that this arrangement allowed efficient and effective impregnating of all surfaces of the final pleated product with a fire suppressive ink, so that the entire product is fire resistant and suppressive.

The second step is to provide a fire suppressive ink that is preferably applied to all surfaces of the Kraft paper using a flexographic printing technique. The ink creates a barrier to heat transfer and undergoes a chemical reaction upon heating that forms water, cools and suppresses a fire. During the chemical reaction, heat is absorbed and water vapor is released, thereby providing a cooling effect.

The fire suppressive ink preferably includes at least one inorganic fusible salt dissolved in an aqueous binder solution that contains an organic resin that facilitates coating and infusing fibrous substrates. The fusible salts of this invention contain at least one water molecule bound to an inorganic salt, and which release water through dehydration or decomposition when heated. Proper selection of the fusible salt or combination of fusible salts must be based upon the water release temperature or temperature range of releasing water molecules. For Kraft paper, the water release temperature range is below 220 degrees Celsius. The water release threshold temperature should be at least 10 degrees Celsius above the ambient service temperature contemplated for the printed Kraft paper.

When more than one fusible salt containing water molecules is used, the additional fusible salt or salts may have a higher water release threshold temperature. This will prolong protection of Kraft paper that is subjected to high heat flux, since the water will not be completely released at one time when the ink reaches a specific temperature. Continuous release of water molecules from the ink over a range of temperatures is desirable. Preferable inorganic fusible salts include hydrated boron-containing compounds, hydrated sulfate compounds, various hydrated phosphate salts, and hydrated silicates. Preferable organic resins for the aqueous binder are acrylic compounds.

More than one resin may be mixed into the aqueous binder solution. Selection of organic resins and their concentration in the aqueous binder solution must be determined by the viscosity preferably applied in the flexographic printing process. One or more anti-foaming agents may be added to facilitate proper printing in the flexographic printing process. Tints may also be added to produce desired colors, but they must not react chemically with any of the other components of the ink. Inks contemplated in preferable embodiments of the present invention do not intumesce when heated, but may do so. Kraft papers printed with the inks may form a char when subjected to direct flame impingement without intumescing. Similarly, foaming of the ink may occur during heat exposure when water molecules are released, but foaming is not required for protection of the Kraft paper by the ink.

The third step is to apply the fire suppressive ink to the surfaces of the papers that will be used to create the pleated paper. Optionally, but preferably, the ink is applied in a flexographic printing process. This is in contrast to traditional means of applying coatings to paper-based products, such as spray coating, blade metering, and curtain coating. Flexographic printing is designed to print bold and highly detailed colored graphics. But the inventors have discovered that the flexographic printing process can be altered to consistently, efficiently and uniformly apply a thin layer of fire suppressive ink to the various sheets of the pleated paper.

In the flexographic printing process, a fountain roller transfers ink from the ink pan to a second roller known as the anilox roller. The surface of the anilox roller contains small wells that hold precise amounts of ink and deliver it to the flexographic printing plate in a uniform thickness evenly and quickly. A doctor blade can also be used to scrape the roller to ensure the correct amount of ink is ultimately delivered to the flexographic printing plate.

The flexographic printing plate itself comprises various layers including a photosensitive printing layer. The printing layer typically has raised areas that accept ink from the anilox roller and print; the printing layer also has non-raised areas that do not receive ink from the anilox roller and do not print. However, in the invention, the printing layer of the flexographic printing plate does not have raised and non-raised areas. Instead, it is planar and utilizes the anilox roller to apply a precise amount of ink uniformly to the surfaces of Kraft paper used to create the pleated paper and to the surfaces of the Kraft paper used for planar support. The inventors have discovered that it is preferred to apply at least two thin layers of fire suppressive ink of approximately 8 billion cubic microns per square inch (BCM) anilox volume. In some embodiments, three or more layers of fire suppressive ink may be applied.

Figure 2:
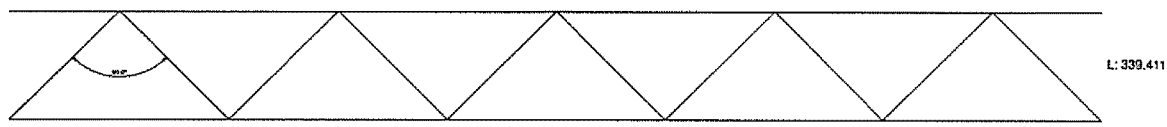
FIG. 2 depicts the pleat profile of the invention.

The fourth step of the invention is to pleat the paper of the invention with an improved profile. First, when compared to Goodrich, the inventors have discovered that preferred pleats have a wider angle of about 88 to 92° and a lower height of approximately three-thirty-seconds of an inch to about one-eighth of an inch. An example of the pleat profile of the invention is shown in FIG. 2. In comparison, an example of the pleat profile of the prior art is shown in FIG. 1. As shown in FIG. 2, the combination of a wider angle and lower height significantly reduces paper usage, increases the length of paper that can be accommodated on each roll, reduces shipping costs, and surprisingly produces pleats that are stronger, more resilient, and virtually indestructible when the Kraft paper is coated with fire suppressive ink. For example, the improved profile pleat is now highly pliable and results in pleated paper that can tightly wrap small objects, such as assorted batches of batteries. In addition, the improved profile pleat can lead to lower shipping costs by substantially reducing the circumference of rolled product and allowing approximately 45% more product to fit into the same space.

Figure 3:
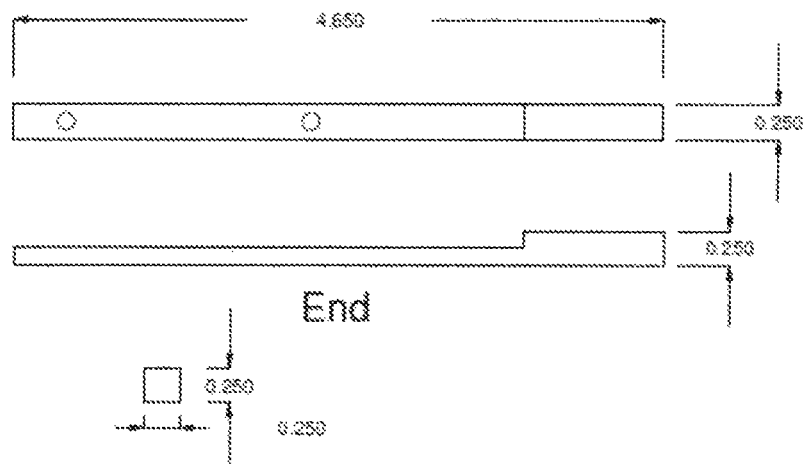
FIG. 3 depicts the pleater finger design of the prior art.
Figure 4:
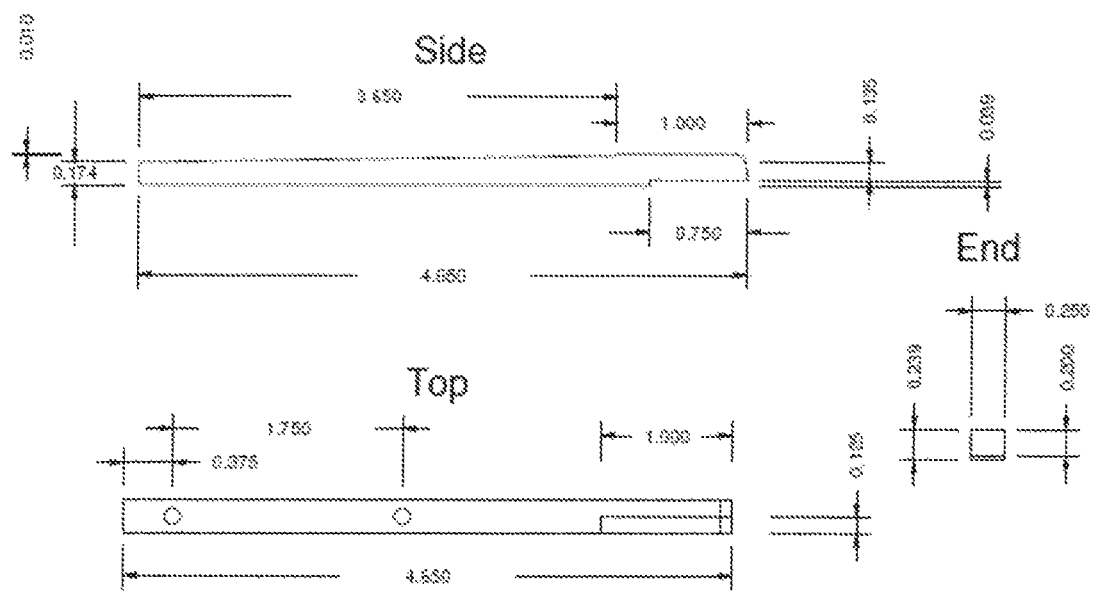
FIG. 4 depicts the pleater finger design of the invention.

The inventors also discovered that this new profile pleat required the implementation of a braking system in the manufacturing process. The braking system slows the pleated paper, pulls open the lower profile pleats and makes them more uniform. The preferred location of the brake is after the pleating means. In addition, the inventors found that materially reducing key width to only 0.125 inches while reducing the surface area of the fingers by 50% created less friction and effectively produced smaller and stronger pleats. An example of the reduced finger configuration of the invention is shown in FIG. 4. In comparison, an example of the finger configuration of the prior art is shown in FIG. 3.

The fifth step of the invention is to bond the pleated paper to at least one planar sheet, and preferably two planar sheets. In this regard, the inventors discovered that it is preferred to use a Kraft paper of approximately 40 to 60 pounds for the planar sheet, as opposed to the relatively low weight tissue paper (approximately 15 pounds) disclosed by Goodrich. The inventors discovered that pleated Kraft paper coated with a fire suppressive ink has significantly greater stacking strength than uncoated tissue paper.

The invention produced pleated paper with dramatically improved fire resistance and fire suppressive qualities, as exemplified by the following comparative example:

Example 1

Pleated paper, without a coating of a fire suppressive ink, was used to wrap lithium batteries. The wrapped batteries were placed into a standard cardboard shipping box. A fire was ignited inside one of the pleated packaging wraps. The fire burned through the pleated wrap in 32 seconds. The fire ignited adjacent pleated packaging wraps, leading to thermal runaway and burning of the entire package.

Example 2

Pleated paper of the invention, which was coated with a fire suppressive ink, was then used to wrap lithium batteries and other flammable items. The fire suppressive ink, which had been applied with a flexographic printing press, was created from Clear Coat CCKool purchased from Fireproof Solutions, Inc. A large cardboard box (16½×16½×17) was lined with the inventive pleat paper. A smaller cardboard box (8½×8½×3½x) was filled with Li-ion batteries wrapped by the inventive pleat paper with a cartridge heater placed vertically in the center of the batteries. The smaller cardboard box was placed on a separator in the large box. A second separator was placed on top of the smaller cardboard box. A second smaller cardboard box (also 8½×8½×3½x) was filled with Li-ion batteries, alkaline batteries, solo cups, and two tablets, all wrapped with the inventive pleat paper, but without a cartridge heater. The second box was placed on top of the separator in the large box. The large box was closed and taped shut.

The power was gradually turned up on the cartridge heater located in the center of the Lithium batteries in the first smaller cardboard box. After one hour, popping could be heard and smoke could be seen coming out of the top of the large box. Five minutes later the cartridge heater was turned off. Popping continued, slowed and then stopped. After 2 hours and 45 minutes, the box was opened and inspected.

It was found that the fire did not burn through the pleated paper wrap of the invention that surrounded the cartridge heater and batteries in the lower smaller box. Instead, based on a thermocouple reading, the Lithium batteries inside the pleated wrap only burned at 350° C. and did so without breaching the inventive pleat wrap. Unlike Example 1, the inventive pleated paper contained the fire, prevented thermal runaway, and protected the contents of the remainder of the large box from being destroyed.

What is claimed is:

1. A method of producing pleated paper with fire suppressive characteristics comprising:
   a. providing Kraft paper for pleating having a weight of 25 to 50 pounds, and Kraft paper for planar support having a weight of approximately 40 to 60 pounds;
   b. applying a fire suppressive ink to surfaces of the Kraft papers;
   c. pleating the Kraft paper having a weight of 25 to 50 pounds so that the apices of each pleat have an angle of about 88 to 92° and a height ranging from approximately 3/32 of an inch to about 1/8 of an inch; and
   d. bonding the pleated paper to at least one sheet of Kraft paper having a weight of approximately 40 to 60 pounds for planar support.

2. The method of claim 1 further comprising bonding the pleated paper to at least two sheets of Kraft paper having a weight of approximately 40 to 60 pounds for planar support.

3. The method of claim 1, wherein the fire suppressive ink comprises at least one inorganic fusible salt and an organic resin.

4. The method of claim 3, wherein the inorganic fusible salt contains at least one water molecule bound to an inorganic salt.

5. The method of claim 3, wherein the inorganic fusible salt releases water when heated.

6. The method of claim 3, wherein the inorganic fusible salt has a water release temperature below 220 degrees Celsius.

7. The method of claim 3, wherein the inorganic fusible salt is selected from the group consisting of (a) hydrated boron-containing compounds, (b) hydrated sulfate compounds, (c) hydrated phosphate salts, and (d) hydrated silicates.

8. The method of claim 3, wherein the organic resin is an acrylic compound.

9. The method of claim 3, wherein the fire suppressive ink comprises at least two inorganic fusible salts, wherein each inorganic fusible salt has a different water release temperature.

10. The method of claim 1, wherein the fire suppressive ink is applied to the surfaces of the Kraft paper with a flexographic printing process.

11. The method of claim 1, wherein the method of producing the pleated paper further comprises a braking system.

12. The method of claim 1, wherein the method of producing the pleated paper is performed with a pair of mating gears that crush the Kraft paper at the apices of each pleat.

13. The method of claim 12, wherein the gap between the mating gears is approximately 0.125 inches.

14. Pleated paper with fire suppressive characteristics, comprising:
   a. pleated Kraft paper having a weight of 25 to 50 pounds, wherein the apices of each pleat has an angle of about 88 to 92° and a pleat height of approximately 3/32 of an inch to about 1/8 of an inch;
b. at least one planar sheet of Kraft paper having a weight of 40 to 60 pounds bonded to the pleated paper; and
c. wherein the surfaces of the pleated and planar Kraft paper are coated with a fire suppressive ink.

15. The pleated paper of claim 14, which further comprises two planar sheets of Kraft paper having a weight of approximately 40 to 60 pounds bonded to the pleated paper.

16. The pleated paper of claim 14, wherein the fire suppressive ink comprises at least one inorganic fusible salt and an organic resin.

17. The pleated paper of claim 16, wherein the inorganic fusible salt contains at least one water molecule bound to an inorganic salt.

18. The pleated paper of claim 16, wherein the inorganic fusible salt releases water when heated.

19. The pleated paper of claim 16, wherein the inorganic fusible salt has a water release temperature below 220 degrees Celsius.

20. The pleated paper of claim 16, wherein the inorganic fusible salt is selected from the group consisting of (a) hydrated boron-containing compounds, (b) hydrated sulfate compounds, (c) hydrated phosphate salts, and (d) hydrated silicates.

21. The pleated paper of claim 16, wherein the organic resin is an acrylic compound.

22. The pleated paper of claim 16, wherein the fire suppressive ink comprises at least two inorganic fusible salts, wherein each inorganic fusible salt has a different water release temperature.

23. The pleated paper of claim 14, wherein the coating of fire suppressive ink is applied by a flexographic printing process.

24. The pleated paper of claim 14, wherein the fire suppressive ink has a coating weight of approximately 8 cubic microns per square inch anilox volume.

25. The pleated paper of claim 14, wherein the pleated and planar Kraft paper has two coatings of fire suppressive ink with a coating weight of approximately 8 cubic microns per square inch anilox volume.

* * * * *